United States Patent [19]

Ellis

[11] Patent Number: 4,692,840
[45] Date of Patent: Sep. 8, 1987

[54] ELECTRIC CIRCUIT MODULE ARRANGEMENTS

[75] Inventor: Stafford M. Ellis, East Preston, England

[73] Assignee: GEC Avionics Limited, England

[21] Appl. No.: 836,988

[22] Filed: Mar. 6, 1986

[30] Foreign Application Priority Data

Mar. 29, 1985 [GB] United Kingdom ............... 8508278
Apr. 4, 1985 [GB] United Kingdom ............... 8508941

[51] Int. Cl.$^4$ .................................. H05K 7/00
[52] U.S. Cl. ............................ 361/393; 361/413
[58] Field of Search ............ 361/393, 395, 396, 415, 361/413, 386, 383

[56] References Cited

U.S. PATENT DOCUMENTS

| | | | |
|---|---|---|---|
| 3,181,034 | 4/1965 | Kell, Jr. et al. | 361/394 |
| 3,316,452 | 4/1967 | Barlow | 361/394 |
| 4,557,225 | 12/1985 | Sagues et al. | 361/383 |

Primary Examiner—Roy N. Envall, Jr.
Attorney, Agent, or Firm—Kirschstein, Kirschstein, Ottinger & Israel

[57] ABSTRACT

An electric circuit module arrangement adapted for mounting in racking comprising a number of modules (C) secured together in side by side relationship. Interconnections (127b, 169) between the modules are provided at one end of the module arrangement and form part of the arrangement while connectors (127a) for establishing connections with other modules outside the arrangement via a wiring arrangement separate from the module arrangement, e.g. supported on the racking, is provided at the other end of the module arrangement.

20 Claims, 5 Drawing Figures

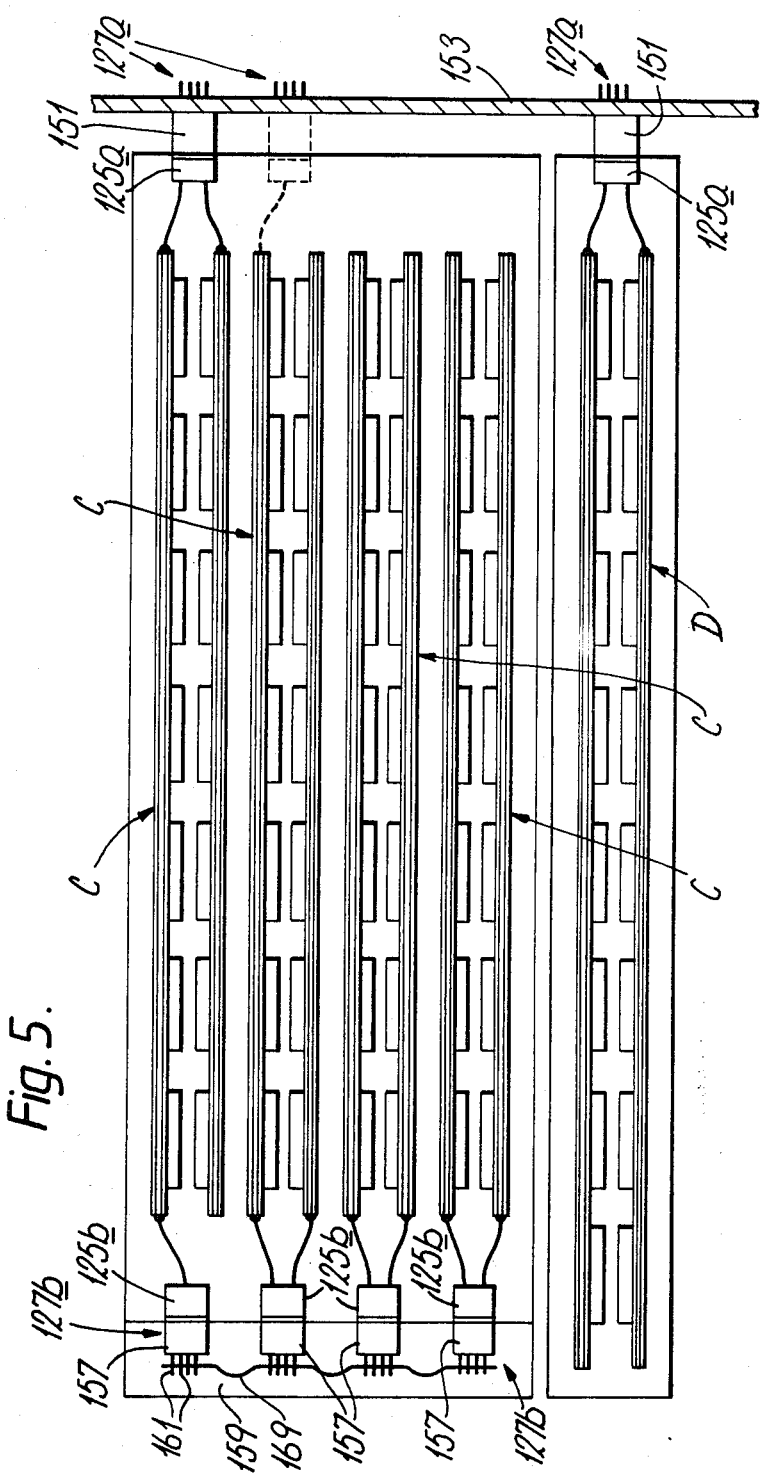

ELECTRIC CIRCUIT MODULE ARRANGEMENTS

BACKGROUND OF THE INVENTION

1. Field of the Invention

This invention relates to electric circuit modules adapted for mounting in racking.

2. Description of Related Art

Such modules comprise a container, typically in the form of a shallow box, housing the electrical components of the module and connections therebetween, the container being adapted to be mounted, e.g. by sliding action, in the racking in side by side relationship with other such modules.

Each such module is normally required to incorporate a path for conduction of heat away from the components, so as to allow modules to be accommodated compactly in the racking without overheating problems.

In addition provision has to be made for external connection of each module e.g. to other modules, and to this end in known arrangements each module is provided at one end, normally the end first inserted into the racking, with an electric connector part adapted to mate with a complementary electric connector part mounted on the racking.

In modern rack mounted electronic equipment the number of contacts required in the module connectors can be so large that the contacts tend to be fragile and unreliable, and the modules need to be accurately positioned with respect to the racking to facilitate mating of the connector parts.

SUMMARY OF THE INVENTION

It is an object of the present invention to provide an electric circuit module arrangement which alleviates these problems.

According to the present invention an electric circuit module arrangement adapted for mounting in racking comprises: a plurality of electric circuit modules secured together in side by side relationship; a plurality of first electric connector parts respectively secured to individual ones of said modules at corresponding ends thereof; a plurality of second electric connector parts, complementary to said first connector parts, and respectively mated with said first connector parts; a wiring arrangement connected with said second connector parts, thereby to provide electrical interconnections between said modules; and at least one third electric connector part, mounted on a said module at the opposite end to the first connector part secured to that module, via which electrical connections between the module arrangement and electric circuits external of the module arrangement may be made.

In one particular arrangement according to the invention, the module arrangement is adapted to be mounted slidingly in racking, and said first connector parts are at the ends of said modules opposite the ends which first enter the racking when the arrangement is slid into the racking.

The present invention also provides an assembly comprising at least one electric circuit module arrangement according to the invention supported in a racking arrangement, the racking arrangement including: for each said third connector part of each said module arrangement, a respective further connector part complementary to and mated with the corresponding said third connector part; and a further wiring arrangement connected with said further connector part so as to interconnect said module arrangement and other electric circuit modules supported by said racking arrangement.

BRIEF DESCRIPTION OF THE DRAWINGS

One electric circuit module arrangement in accordance with the invention, and a racking arrangement for supporting the module, together with other modules, will now be described, by way of example, with reference to the accompanying drawings in which:

FIG. 5 is a simplified representation of the interconnection arrangement between modules.

DETAILED DESCRIPTION OF THE PREFERRED EMBODIMENTS

Figure 1:
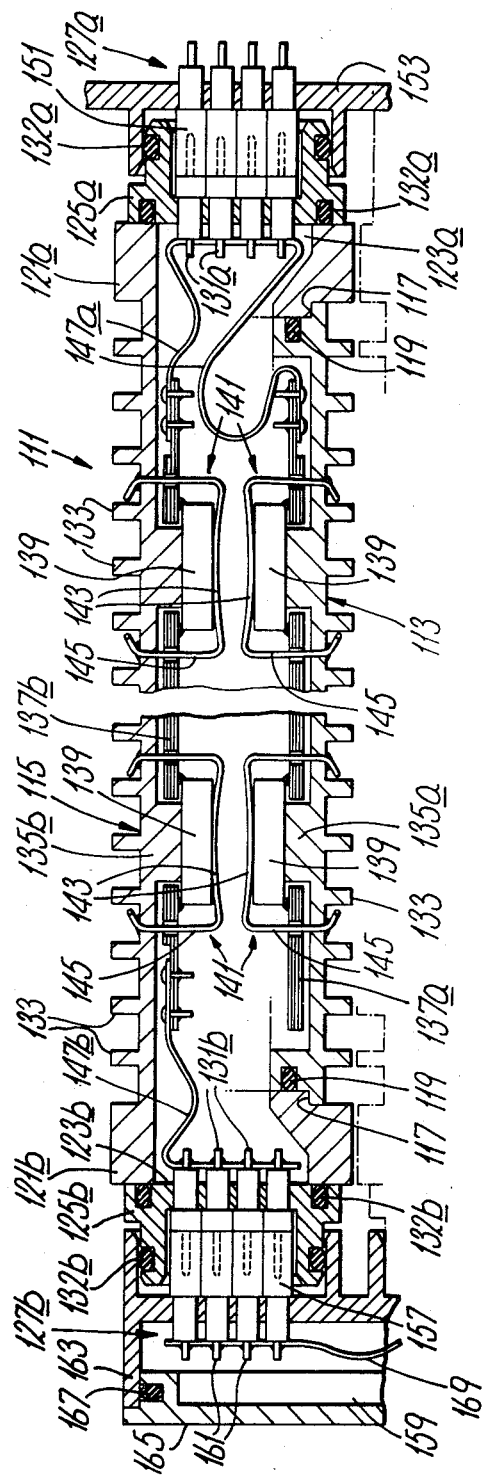
FIG. 1 is a sectional view of one of four modules incorporated in the module arrangement.
Figure 2:
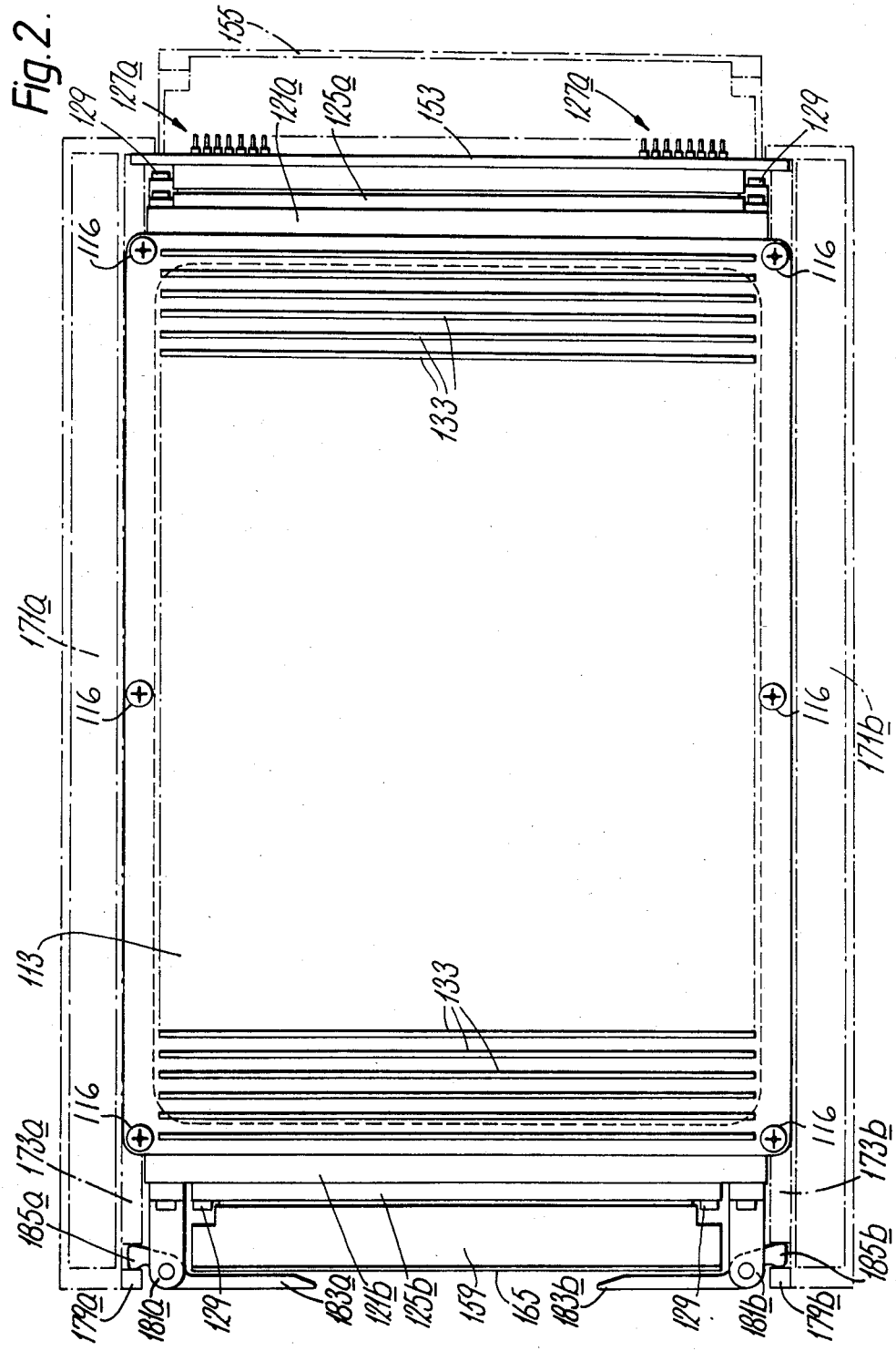
FIG. 2 shows in side elevation an external view of the module arrangement received by and retained in the racking.

Referring to FIG. 1, each of the modules supported by the racking is in the form of a shallow box 111 having two separable heat conductive metal parts, a lid part 113 and a tray part 115, the lid part 113 being secured to the tray part 115 by screws 116 (see FIG. 2). Complementary surfaces 117 at the edges of the lid and tray parts 113 and 115 serve to define the position of the lid part 113 with respect to the tray part 115, and an environmental seal 119 located in a groove around the edge of the lid part 113 contacts the edge of the tray part 115.

Rear and front walls 121a, 121b of the tray part 115 have elongate apertures 123a and 123b respectively. The pin part 125a of a first elongate multi-way pin and socket connector 127a is secured by screws 129 (FIGS. 2 and 3) to the tray part 115 with its pin 131a projecting through the elongate aperture 123a, into the tray part 115. Similarly, the pin part 125b of a second elongate multi-way pin and socket connector 127b is secured by screws 129 (FIGS. 2 and 3) to the opposite end wall 121b of the tray part 115 with connector pins 131b projecting through the other elongate aperture 123b into the tray part 115. The connectors 127a, 127b are provided with environmental seals 132a, 132b.

The external major surfaces of the lid and tray parts 113 and 115 have a large number of parallel spaced ribs 133.

The major interior surfaces of the lid part and the tray part 113 and 115 have integral pad portions 135a, 135b distributed in rows and columns over the surface area.

Flexible printed circuit boards 137a, 137b having apertures corresponding in position to the pad portions 135a, 135b are located in the lid and tray parts 113 and 115 respectively with the pad portions received by the apertures.

Electrical components 139, for example, chip carriers, are positioned each in intimate contact with the inwards facing surface of an individual pad portion 135a or 135b, each being pressed into good thermal contact with the associated pad portion by means of a U-shaped spring clip 141 suitably made of wire.

The bridge portion 143 of each clip 141 is in pressure contact with the component 139, and the limb portions 145 of each clip 142 extend through holes in the printed circuit board 137a or 137b, to each side of the pad portion 135a or 135b, and through holes through the lid part 113 or the tray part 115 at positions between the external ribs 133. The ends of the limbs 143 are secured, as by solder, to the lid 133 or tray 115.

The flexible printed circuit boards 137a, 137b have a complex pattern of conductive track and these are selectively connected to the terminal pins 131a, 131b of the connector parts 125a, 125b respectively, by conductive tracks incorporated in flexitapes 147a, 147b.

Figure 3:
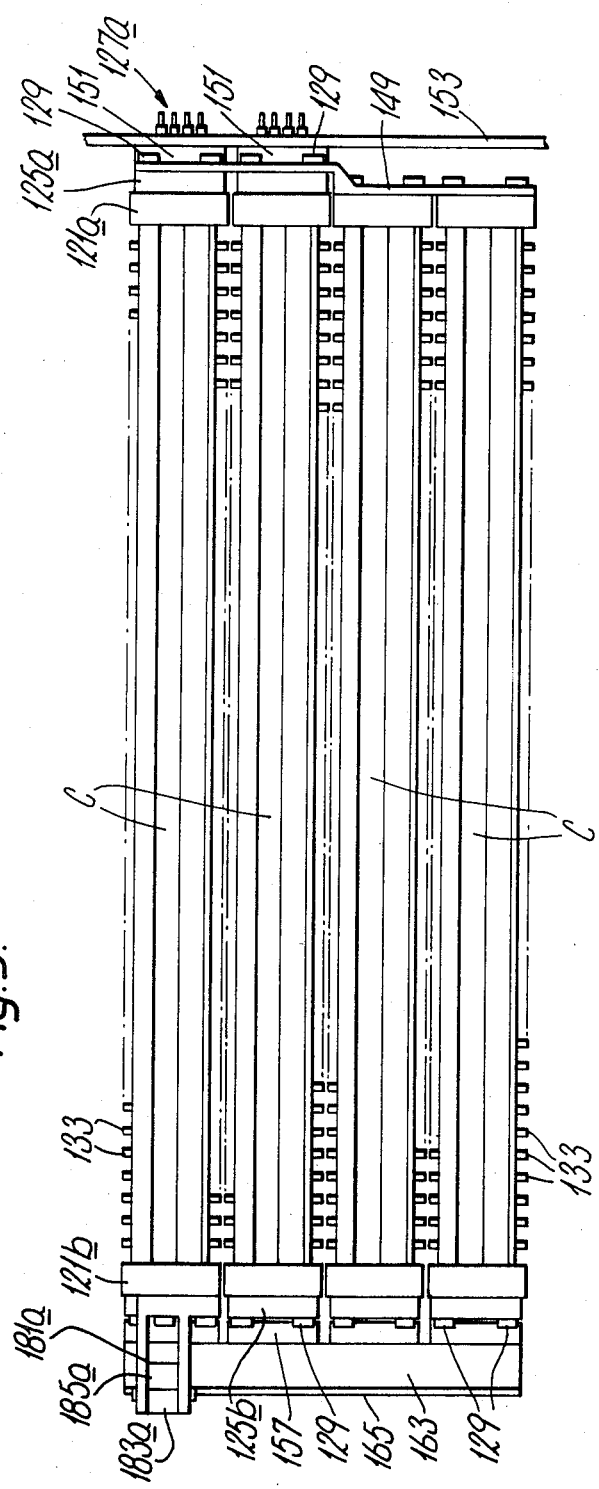
FIG. 3 shows a plan view of the module arrangement of FIG. 2, but with the racking removed so as to reveal the four modules of the arrangement ganged together.
Figure 4:
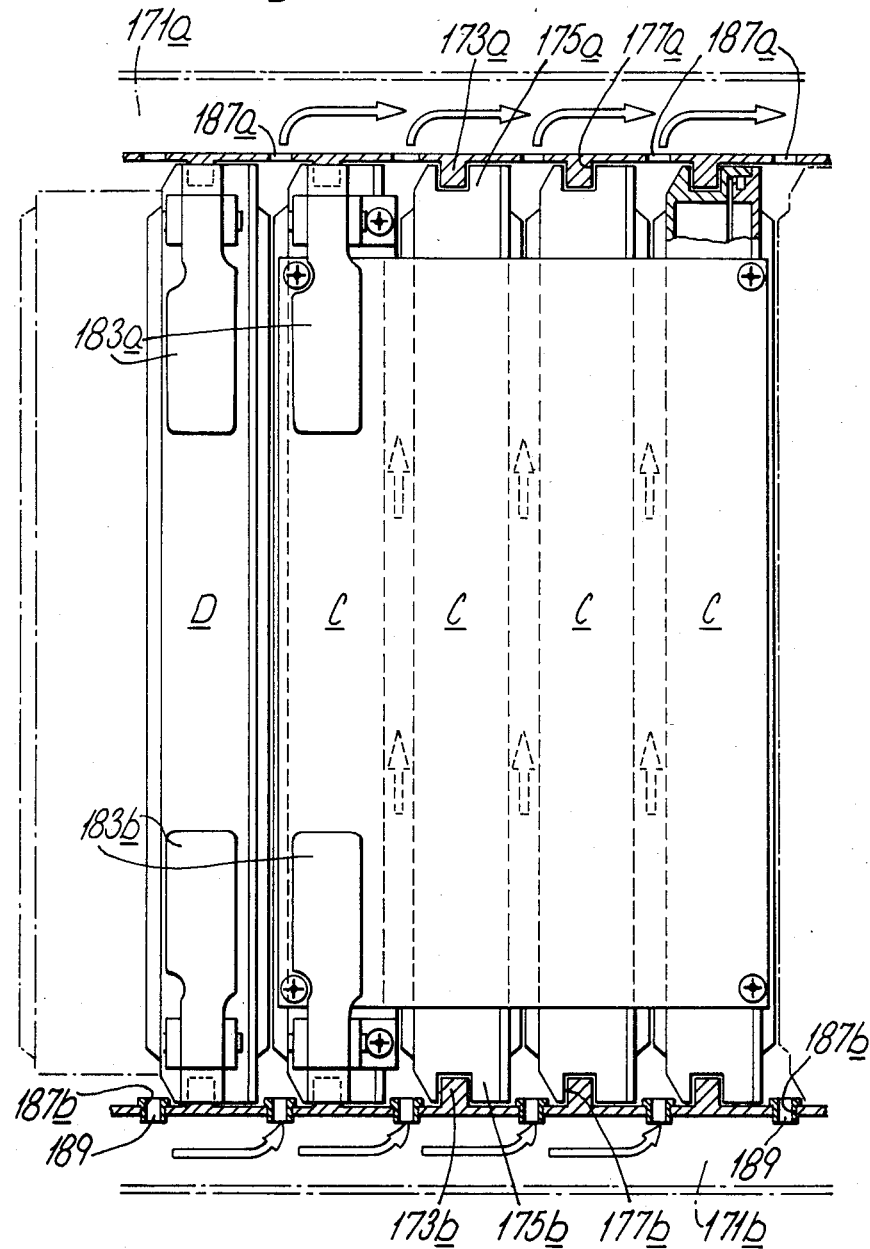
FIG. 4 shows in end elevation the arrangement of FIGS. 2 and 3 together another module.

As illustrated in FIGS. 2, 3 and 4 the module is arranged to fit slidingly into racking in parallel spaced relationship with other similar modules. As further explained below, some of the other modules have one only of connector parts 125a and 125b.

Some groups of adjacent modules in the racking are ganged together to form module arrangements in accordance with the invention. In the drawings one such module arrangement comprising four modules C, best seen in FIGS. 3, 4 and 5, is shown, the modules C being ganged together at one end by means of a cross-strap 149 as shown in FIG. 3. Other modules in the racking may be unganged, one such single unganged module D being shown in FIGS. 4 and 5.

A limited number only, typically one or two only, of the modules in each ganged group of modules, is provided with a connector part 125a. Each such connector part 125a is in mating engagement with a respective complementary connector part 151 mounted on a back plate 153 forming part of the racking. The outlet pins from the connector parts 151 project through the back plate 153 and are connected to tracks of a printed circuit board (not shown) within a housing 155 which effect data traffic flow between electrical components of that group of ganged modules and the electrical components of other single modules or groups of ganged modules.

Every module in each group of ganged modules has a connector part 125b which mates with a respective complementary connector part 157 mounted on the base of a tray part 163 of a housing 159 with its several electrical terminal pins 161 projecting through holes into the interior of the housing 159. The housing 159 is completed by a lid part 165 and, between the two parts, an environmental seal 167. The housing 159 serves to further secure the ganged modules (C) together.

Within the housing 159 there is a flexible printed circuit 169 provided with a pattern of conductive tracks which interconnect in any desired manner the terminal pins 161, thereby to determine the traffic in data between the modules of a group of ganged modules.

It will be appreciated that each single, unganged module is provided with a rear connector part 125a only which mates with a complementary connector part 151 mounted on back plate 153, data signal traffic to and from each unganged module being by way of the printed circuit board within housing 155. Thus the single modules have no connector part 125b.

It will be gathered from the foregoing description relating to the connector arrangement at the front and rear of the ganged modules that whereas the rear connector 127a is concerned with data traffic, in particular, between different groups of ganged modules or between such ganged modules and single modules, the front connector 127b is concerned with data traffic only between modules within a ganged group.

The racking has an upper plenum chamber 171a and a lower plenum chamber 171b.

The inwards facing walls of the two plenum chambers 171a, 171b, L have opposed ribs 173a, 173b (FIG. 4); and the top and bottom walls 175a, 175b of the modules have fore and aft extending grooves 177a, 177b, respectively, which receive the opposed ribs 173a, 173b.

One of each set of ganged modules and each single, unganged module has projecting from its front wall 121b, upper and lower posts 181a, 181b. Manually operable levers 183a, 183b, pivotally connected to the ends of the posts 181a, 181b have tail portions 185a, 185b which lie in the spaces between the end projections 179a, 179b and the forward ends of the ribs 173a, 173b. The levers 183a, 183b facilitate insertion and removal of the modules into and from the racking between the plenum chambers 171a, 171b against the considerable force required to make or break the multi-pin connector between a module, or set of ganged modules, and the printed circuit board within the housing 155.

It will be understood that the modules are a low friction sliding fit with the inwards facing walls of the plenum chambers 171a, 171b and there is no provision for clamping the modules to the plenum chambers or, indeed, any other part of the racking.

The upper plenum 171a has between adjacent module guide ribs 173a a multiplicity of openings 187a, spaced apart at intervals, between ribs 173a. The lower plenum 171b has between adjacent module guide ribs 173b, a multiplicity of openings 187b, spaced apart at intervals, between ribs 173b. The latter openings may, as illustrated, each have a metering orifice 189.

By virtue of external ribs 133 on the external major surfaces of the lid and tray portions 113 and 115 of the modules the external total surface area of these surfaces is relatively large. The ribs 133 serve as baffles directing cooling air through the openings 187b from the lower plenum chamber 171b vertically upwards to the openings 187a of the upper plenum chamber 171a.

The distribution of the ribs 133 is such that, as shown, ribs 133 of external surfaces of adjacent modules cooperate, when the levers 183a, 183b are in the position shown, and when the connectors between the modules and the printed circuit board within the housing 155 is fully made to form substantially closed conduits through which the cooling air flows between the lower and upper plenum chambers 171a, 171b.

The advantages of using module arrangements in accordance with the invention in rack mounted electronic equipment are as follows. In each group of modules forming a module arrangement according to the invention the required interconnections between the modules of the group are at one end, and the connections at the other end via racking mounted connector parts and the associated wiring provide only the required interconnections between the modules of the group and other modules etc. outside the group. Consequently the number of connections made via the racking mounted connector parts is relatively small and these connector parts may therefore be made relatively robust and reliable, and such as not to require accurate positioning with respect to the complementary connector parts on the module arrangement to facilitate mating therewith. Furthermore the complexity of the wiring arrangement associated with the racking mounted connector parts is reduced.

The apparatus of FIGS. 1 to 5 has other advantageous features and characteristics arising from the form of the modules.

The use of the lid and tray parts 113 and 115 of the box 111 to serve as ribbed cold walls for the components kept cool by flow-by cooling and the avoidance, in consequence, of the need for a separate core to serve as a cold wall for the components results in a significant weight advantage with good thermal performance.

By spring loading electrical components 139 directly to the ribbed walls, thermal performance is further improved.

I claim:

1. An electric circuit module arrangement adapted for mounting in racking comprising: a plurality of electric circuit modules secured together in side by side relationship; a plurality of first electric connector parts respectively secured to individual ones of said modules at corresponding ends thereof; a plurality of second electric connector parts, complementary to said first connector parts, and respectively mated with said first connector parts; a wiring arrangement connected with said second connector parts thereby to provide electrical interconnections between said modules; and at least one third electric connector part, mounted on a said module at the opposite end to the first connector part secured to that module, via which electrical connections between the module arrangement and electric circuits external of the module arrangement may be made.

2. A module arrangement according to claim 1 adapted to be mounted slidingly in racking and wherein said first connector parts are at the ends of said modules opposite the ends which first enter the racking when the arrangement is slid into the racking.

3. A module arrangement according to claim 1 wherein said connector parts are parts of multi-way pin and socket connectors.

4. A module arrangement according to claim 3 wherein said first and third connector parts are pin parts of multi-way pin and socket connectors.

5. A module arrangement according to claim 1 wherein a said third connector part is mounted on less than all said modules.

6. A module arrangement according to claim 5 wherein said modules are secured together at least partly by a cross strap which serves to connect electrically a said third electric connector part and a module on which a said third electric connector part is not mounted.

7. A module arrangement according to claim 1 wherein said modules are secured together at least partly by a housing for said second connector parts and said wiring arrangement.

8. A module arrangement according to claim 1 wherein each said module comprises: a box comprising two heat conductive parts each of which comprises one major wall of the box; and electrical components mounted on the interior major surfaces of said two parts, said parts providing heat paths between the components mounted thereon and external surface portions of said box.

9. A module arrangement according to claim 8 wherein said external surface portions comprise external major surfaces of said box parts.

10. A module arrangement according to claim 9 wherein said external major surfaces of said box parts have a configuration of rib portions.

11. A module arrangement according to claim 10 wherein said rib portions are adapted to co-operate with rib portions of adjacent modules mounted in parallel spaced relationship to form baffles for directing a flow of cooling fluid over said external major surfaces of said box parts, between chambers on opposite sides of the modules.

12. A module arrangement according to claim 8 wherein at least some of said components are mounted in surface contact with portions of said interior major surfaces.

13. A module arrangement according to claim 12 wherein said portions of said interior major surfaces are constituted by inward facing surfaces of pad portions of said interior major surfaces.

14. A module arrangement according to claim 13 wherein each of said at least some electrical components is pressed into surface contact with its pad portion by means of an individual U-shaped spring clip having two limb portions which are fixed at their ends to the associated box part, and a bridge portion which bears against the electrical component so as to hold the electrical component in contact with the said inward facing surface under spring pressure.

15. A module arrangement according to claim 14 wherein said two limb portions extend through spaced apart apertures in the associated box part, and are fixed thereto.

16. A module arrangement according to claim 15 wherein said limb portions are fixed to said box parts by soldering.

17. A module arrangement according to claim 13 further including a printed circuit board having a distribution of apertures corresponding to the distribution of pad portions located within a said box part with the pad portions received by the said apertures of the board and the electrical components in contact with the pad portions electrically connected to tracks of the board.

18. A module arrangement according to claim 8 wherein said first and third connector parts are secured in apertures in side walls of said box parts.

19. A module arrangement according to claim 1 provided with lever means for assisting in disconnection of said third connector part from a complementary connector part.

20. An assembly comprising at least one electric circuit module arrangement according to claim 1 supported in a racking arrangement, the racking arrangement including: for each said third connector part of each said module arrangement, a respective further connector part complementary to and mated with the corresponding said third connector part; and a further wiring arrangement connected with said further connector part so as to interconnect said module arrangement and other electric circuit modules supported by said racking arrangement.

* * * * *